(12) United States Patent
Zhang

(10) Patent No.: US 10,763,609 B2
(45) Date of Patent: Sep. 1, 2020

(54) ELECTRICALLY CONDUCTIVE TERMINAL AND CONNECTOR

(71) Applicant: Tyco Electronics (Shanghai) Co. Ltd., Shanghai (CN)

(72) Inventor: Zhicheng Zhang, Shanghai (CN)

(73) Assignee: Tyco Electronics (Shanghai) Co. Ltd., Shanghai (CN)

(*) Notice: Subject to any disclaimer, the term of this patent is extended or adjusted under 35 U.S.C. 154(b) by 0 days.

(21) Appl. No.: 16/136,805

(22) Filed: Sep. 20, 2018

(65) Prior Publication Data

US 2019/0089081 A1 Mar. 21, 2019

(30) Foreign Application Priority Data

Sep. 20, 2017 (CN) .......................... 2017 1 0854305

(51) Int. Cl.
| | |
|---|---|
| *H01R 13/11* | (2006.01) |
| *H01R 13/24* | (2006.01) |
| *H01R 4/58* | (2006.01) |
| *H01R 12/58* | (2011.01) |
| *H01R 4/02* | (2006.01) |
| *H01R 13/05* | (2006.01) |
| *H05K 3/30* | (2006.01) |
| *H01R 13/42* | (2006.01) |
| *H01R 12/70* | (2011.01) |

(52) U.S. Cl.
CPC .............. *H01R 13/11* (2013.01); *H01R 4/02* (2013.01); *H01R 4/58* (2013.01); *H01R 12/58* (2013.01); *H01R 13/055* (2013.01); *H01R 13/24* (2013.01); *H01R 12/707* (2013.01); *H01R 13/42* (2013.01); *H05K 3/306* (2013.01)

(58) Field of Classification Search
CPC . H01R 13/11; H01R 4/02; H01R 4/58; H01R 12/58
USPC .......................................................... 439/775
See application file for complete search history.

(56) References Cited

U.S. PATENT DOCUMENTS

| | | | | |
|---|---|---|---|---|
| 5,007,865 A | * | 4/1991 | Jakobeit | ................. H01R 13/18 439/839 |
| 5,224,884 A | * | 7/1993 | Singer | .................... H01R 13/26 439/819 |
| 5,431,576 A | | 7/1995 | Matthews | |
| 5,702,272 A | * | 12/1997 | MacHida | ............. H01R 13/113 439/843 |
| 5,951,339 A | * | 9/1999 | Chaillot | ............... H01R 13/113 439/852 |

(Continued)

*Primary Examiner* — Peter G Leigh
(74) *Attorney, Agent, or Firm* — Barley Snyder

(57) ABSTRACT

An electrically conductive terminal that has a first terminal at its outer layer and a second terminal at its inner layer. The first terminal has a first contact portion at an end thereof. The second terminal is on an inner surface side of the first terminal and has a second contact portion at an end thereof. There is an opening in the first contact portion. A raised portion is on the second contact portion. The raised portion passes through the first terminal via the opening, so as to electrically contact with a mating member. The first terminal at the outer layer and the second terminal at the inner layer may be in electrical contact with the mating member simultaneously, so that the electrically conductive terminal may carry a larger electric current. The electrically conductive terminal can be part of a connector.

30 Claims, 3 Drawing Sheets

(56) References Cited

U.S. PATENT DOCUMENTS

| | | | |
|---|---|---|---|
| 6,524,142 B2* | 2/2003 | Heimueller | H01R 13/113 439/843 |
| 6,679,738 B2* | 1/2004 | Nimura | H01R 13/114 439/752.5 |
| 7,104,812 B1* | 9/2006 | Bogiel | H01R 13/03 439/79 |
| 7,553,203 B2* | 6/2009 | Anbo | H01R 13/11 439/852 |
| 7,581,972 B2 | 9/2009 | Daamen | |
| 7,595,715 B2* | 9/2009 | Pavlovic | H01H 85/0417 337/187 |
| 7,766,664 B2* | 8/2010 | Cheng | H01R 12/7088 439/65 |
| 7,876,193 B2* | 1/2011 | Pavlovic | H01H 85/0417 337/187 |
| 7,892,050 B2* | 2/2011 | Pavlovic | H01R 9/245 439/250 |
| 8,388,389 B2* | 3/2013 | Costello | H01R 13/18 439/637 |
| 8,449,338 B2 | 5/2013 | Gong et al. | |
| 8,475,220 B2* | 7/2013 | Glick | H01R 13/113 439/839 |
| 8,992,270 B2* | 3/2015 | Glick | H01R 13/18 439/839 |
| 9,142,902 B2* | 9/2015 | Glick | H01R 13/18 |
| 9,190,756 B2* | 11/2015 | Glick | H01R 13/18 |
| 9,293,852 B2* | 3/2016 | Glick | H01R 43/20 |
| 9,300,069 B2* | 3/2016 | Morello | H01R 13/18 |
| 9,437,974 B2* | 9/2016 | Glick | H01R 13/642 |
| 9,680,236 B2* | 6/2017 | Ngo | H01R 12/724 |
| 2006/0223385 A1* | 10/2006 | Pavlovic | H01R 13/113 439/858 |
| 2011/0076901 A1* | 3/2011 | Glick | H01R 9/245 439/839 |
| 2013/0012072 A1 | 1/2013 | Costello et al. | |
| 2014/0273659 A1* | 9/2014 | Glick | H01R 13/18 439/839 |
| 2017/0214165 A1* | 7/2017 | Brungard | H01R 12/7088 |
| 2019/0089081 A1* | 3/2019 | Zhang | H01R 13/11 |

* cited by examiner

ELECTRICALLY CONDUCTIVE TERMINAL AND CONNECTOR

CROSS-REFERENCE TO RELATED APPLICATION

This application claims the benefit of the filing date under 35 U.S.C. § 119(a)-(d) of Chinese Patent Application No. 201710854305.2 filed on Sep. 20, 2017.

FIELD OF THE INVENTION

The disclosure relates to an electrically conductive terminal and a connector including said electrically conductive terminal.

BACKGROUND

Prior power supply connectors usually include an insulation body and an electrically conductive terminal (e.g., a power supply terminal) held in the insulation body. The electrically conductive terminal of the prior power supply connector is usually designed in a single-layer structure and a plurality of contacts are usually formed on the single-layer electrically conductive terminal. Due to the poor mechanical strength and electrical conductivity of the single-layer electrically conductive terminal, an electrically conductive terminal having a double-layer structure has been proposed in the prior art and the double-layer electrically conductive terminal usually includes an inner layer terminal at its inner layer and an outer layer terminal at its outer layer. The inner layer terminal is usually made of copper and the outer layer terminal is usually made of stainless steel. The outer layer terminal is clamped onto the inner layer terminal to improve the clamping force of the entire electrically conductive terminal and to ensure the reliability of electrical contact. The outer layer stainless steel terminal has a length that is smaller than a length of the inner layer copper terminal and does not make electrical contact with a mating member (e.g., a bus-bar). Only the inner layer copper terminal is in electrical contact with the mating member and, therefore, the current carrying capability of the electrically conductive terminal is limited. However, as the application electric current becomes larger and larger, the electrically conductive terminal of the power supply connector is required to carry a larger electric current. Thus, the prior electrically conductive terminal having the double-layer structure is no longer satisfactory.

SUMMARY

An electrically conductive terminal, constructed in accordance with the present invention, includes an outer layer and an inner layer. The outer layer has a first terminal having a first contact portion at an end thereof and an opening in the first contact portion. The inner layer has a second terminal on an inner surface side of the first terminal and has a second contact portion at an end thereof and a raised portion on the second contact portion that passes through the opening in the first terminal to make electrical contact with a mating member.

Another aspect of the present invention is that of a connector, such as a power supply connector, that can include the electrically conductive terminal and an insulation body.

DETAILED DESCRIPTION OF THE EMBODIMENT(S)

Figure 1:
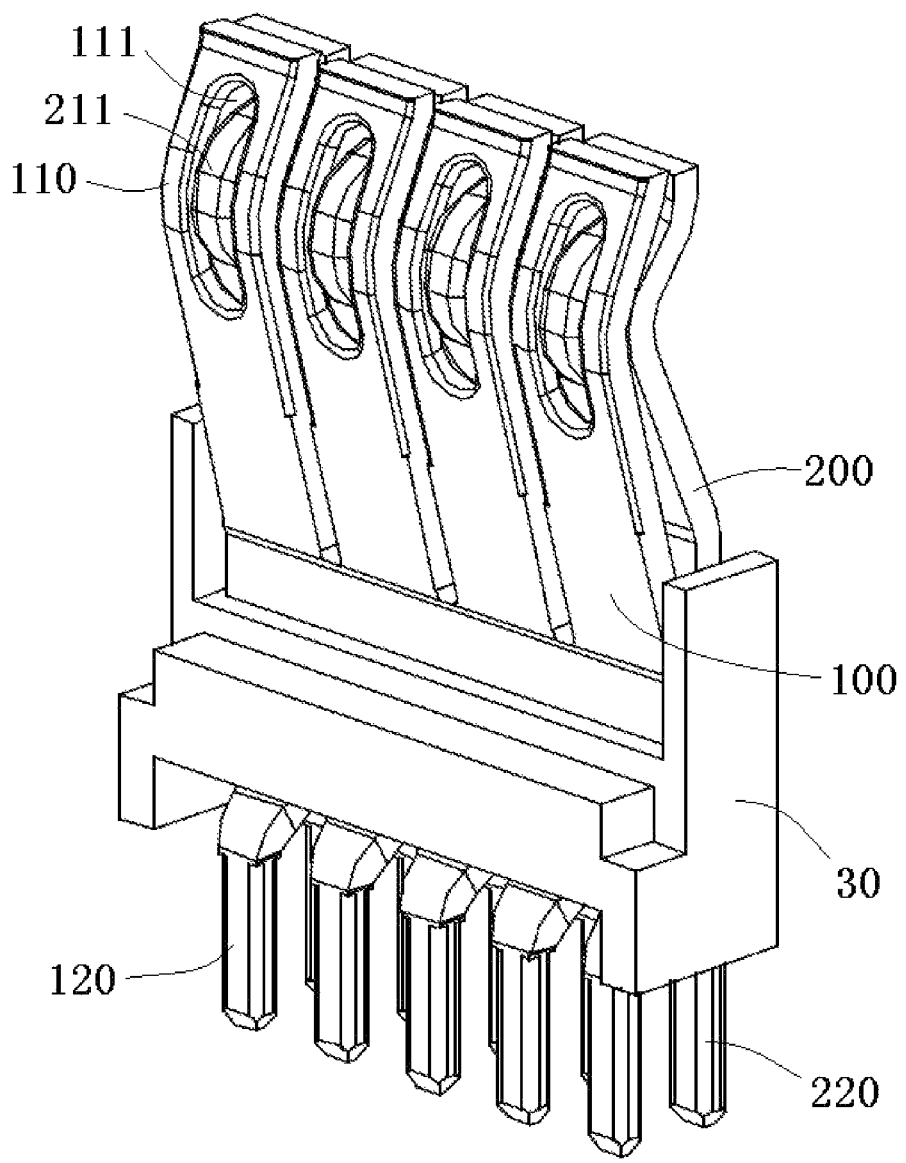
FIG. 1 shows a schematic perspective view of a connector according to an exemplary embodiment of the present invention.

Hereinafter, technical solutions of the present invention will be further specifically described by way of examples and with reference to the accompanying drawings. In the description, the same or similar reference numerals indicate the same or similar members. The following description of the disclosure is intended to explain the general inventive concept of the present invention and should not be construed as a limitation of the disclosure.

Moreover, in the following detailed description, numerous specific details are set forth to provide a thorough understanding of the embodiments of the present. Obviously, however, one or more embodiments may be practiced without these specific details. In other instances, well-known structures and devices are shown in diagrams to simplify the drawings.

Figure 2:
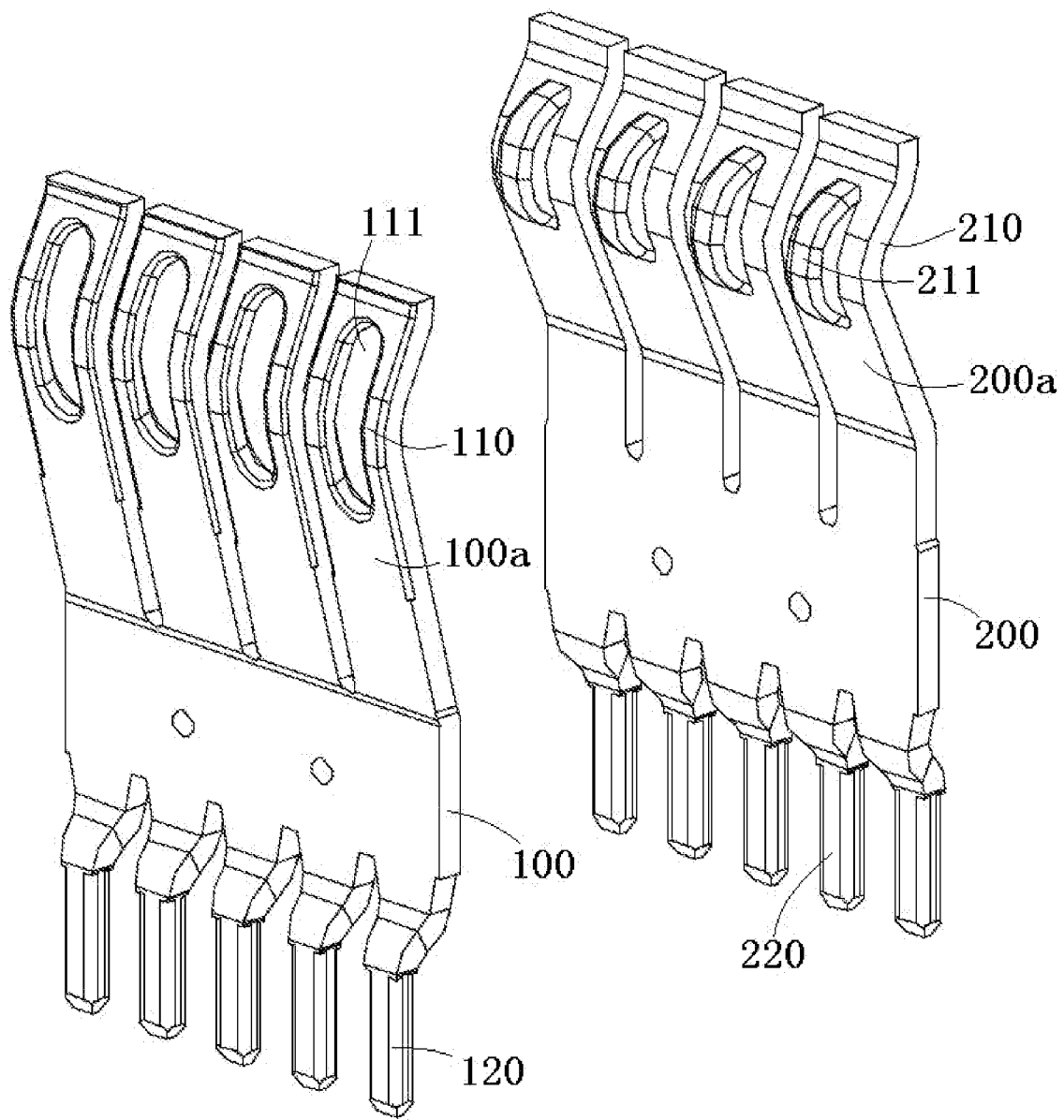
FIG. 2 shows a schematically exploded view of an electrically conductive terminal of the connector shown in FIG. 1.

As shown in FIGS. 1 and 2, in the illustrated embodiment of the present invention, the electrically conductive terminal has a double-layer structure, that is to say, the electrically conductive terminal includes a first terminal 100 at its outer layer and a second terminal 200 at its inner layer.

As shown in FIGS. 1 and 2, in the illustrated embodiment of the present invention, the first terminal 100 has a first contact portion 110 at an end thereof. The second terminal 200 is on an inner surface side of the first terminal 100 and has a second contact portion 210 at an end thereof.

As shown in FIGS. 1 and 2, in the illustrated embodiment of the present invention, there is an opening 111 in the first contact portion 110 and a raised portion 211 on the second contact portion 210. The raised portion 211 of the second terminal 200 passes through the first terminal 100 in a thickness direction via the opening 111 of the first terminal 100 so as to make electrical contact with a mating member (not shown, for example, a bus-bar) at the outer surface side of the first terminal 100. Thus, as shown in FIGS. 1 and 2, the raised portion 211 of the second terminal 200, together with the first contact portion 110 of the first terminal 100, may be in electrical contact with the mating member at the outer surface side of the first terminal 100.

As shown in FIGS. 1 and 2, in the illustrated embodiment of the present invention, a height of the raised portion 211 of the second terminal 200 is greater than a material thickness of the first contact portion 110 of the first terminal 100, such that the raised portion 211 protrudes from an outer surface of the first terminal 100 via the opening 111 when the second contact portion 210 of the second terminal 200 abuts against an inner surface side of the first contact portion 110 of the first terminal 100.

As shown in FIGS. 1 and 2, in the illustrated embodiment of the present invention, the second contact portion 210 of the second terminal 200 abuts against the inner surface side of the first contact portion 110 of the first terminal 100 and the raised portion 211 of the second terminal 200 protrudes from the outer surface of the first terminal 100, so that in a process of mating with the mating member, the mating member first contacts with the raised portion 211 of the second terminal 200 and then contacts with the first contact portion 110 of the first terminal 100. An advantage of such a design is in that it could ensure reliable electrical contact between the mating member and the second terminal 200 at the inner layer.

However, the disclosure of the present invention is not limited to the illustrated embodiment. For example, in another embodiment of the present invention, there is an interval between the second contact portion 210 of the second terminal 200 and the inner surface side of the first contact portion 110 of the first terminal 100, so that the raised portion 211 of the second terminal 200 may be flush with an outer surface of the first terminal 100. As such, in a process of mating with the mating member, the mating member makes electrical contact simultaneously with the first contact portion 110 of the first terminal 100 and the raised portion 211 of the second terminal 200.

In another embodiment of the present invention, there is an interval between the second contact portion 210 of the second terminal 200 and the inner surface side of the first contact portion 110 of the first terminal 100 such that the raised portion 211 of the second terminal 200 is lower than an outer surface of the first terminal 100. As such, in a process of mating with the mating member, the mating member first contacts with the first contact portion 110 of the first terminal 100 and pushes the first terminal 100 to elastically move toward the second terminal 200 and then the mating member contacts with the raised portion 211 of the second terminal 200.

As shown in FIGS. 1 and 2, in the illustrated embodiment of the present invention, a length of the second terminal 200 at the inner layer may not be limited by the first terminal 100 at the outer layer, that is to say, the length of the second terminal 200 may be equal to, or greater than, or less than the length of the first terminal 100.

As shown in FIGS. 1 and 2, in the illustrated embodiment of the present invention, the second terminal 200 at the inner layer may have a thickness that is not limited by the first terminal 100 at the outer layer, that is to say, the second terminal 200 may have a thickness equal to, or greater than, or less than a thickness of the first terminal 100.

As shown in FIGS. 1 and 2, in the illustrated embodiment of the present invention, the first terminal 100 includes a first fixing portion fixed in an insulation body 30 and a row of first elastic cantilevers 100*a* on one side of the first fixing portion. A first contact portion 110 is formed at a free end of each first elastic cantilever 100*a*. The second terminal 200 includes a second fixing portion fixed in the insulation body 30 and a row of second elastic cantilevers 200*a* on one side of the second fixing portion. A second contact portion 210 is at a free end of each second elastic cantilever 200*a*.

As shown in FIGS. 1 and 2, in the illustrated embodiment of the present invention, the first fixing portion of the first terminal 100 and the second fixing portion of the second terminal 200 are plate-shaped and parallel to each other. An inclination angle of the first elastic cantilever 100*a* with respect to the first fixing portion is less than an inclination angle of the second elastic cantilever 200*a* with respect to the second fixing portion, so that the first elastic cantilever 100*a* and the second elastic cantilever 200*a* are not parallel, thereby ensuring that the raised portion 211 of the second terminal 200 is always in reliable electrical contact with the mating member.

As shown in FIGS. 1 and 2, in the illustrated embodiment of the present invention, a length of the first elastic cantilever 100*a* is greater than a length of the second elastic cantilever 200*a*, such that the second elastic cantilever 200*a* generates a larger contact pressure, so as to ensure that the raised portion 211 of the second terminal 200 is in reliable electrical contact with the mating member.

As shown in FIGS. 1 and 2, in the illustrated embodiment of the present invention, the raised portion 211 on each second contact portion 210 passes through the first terminal 100 in a thickness direction via the opening 111 in a corresponding first contact portion 110.

As shown in FIGS. 1 and 2, in the illustrated embodiment of the present invention, each opening 111 is in a middle position in a width direction of a corresponding first elastic cantilever 100*a*. Correspondingly, each raised portion 211 is in a middle position in a width direction of a corresponding second elastic cantilever 200*a*.

As shown in FIGS. 1 and 2, in the illustrated embodiment of the present invention, the opening 111 is a closed hole in the first elastic cantilever 100*a*. However, the present invention is not limited thereto and the opening 111 may also be an opened hole that is opened on one side.

As shown in FIGS. 1 and 2, in the illustrated embodiment of the present invention, the first terminal 100 further includes a row of first connection legs 120 on the other side of the first fixing portion and adapted to be electrically connected to a circuit board (not shown). The second terminal 200 further includes a row of second connection legs 220 on the other side of the second fixing portion and adapted to be electrically connected to a circuit board.

As shown in FIGS. 1 and 2, in the illustrated embodiment, the first connection leg 120 and the second connection leg 220 are pin-shaped solder legs adapted to be soldered into holes of a circuit board. However, the present invention is not limited thereto and the first connection leg and/or the second connection leg may also be a plate-shaped solder leg adapted to be soldered onto a surface of a circuit board or may also be a fisheye-shaped plug-in leg adapted to be plugged into a hole of the circuit board.

As shown in FIGS. 1 and 2, in the illustrated embodiment of the present invention, the first terminal 100 and the second terminal 200 are two independent members separated from each other. However, the present invention is not limited thereto and the first terminal 100 and the second terminal 200 may be a single one-piece member made of a single metal material plate.

Figure 3:
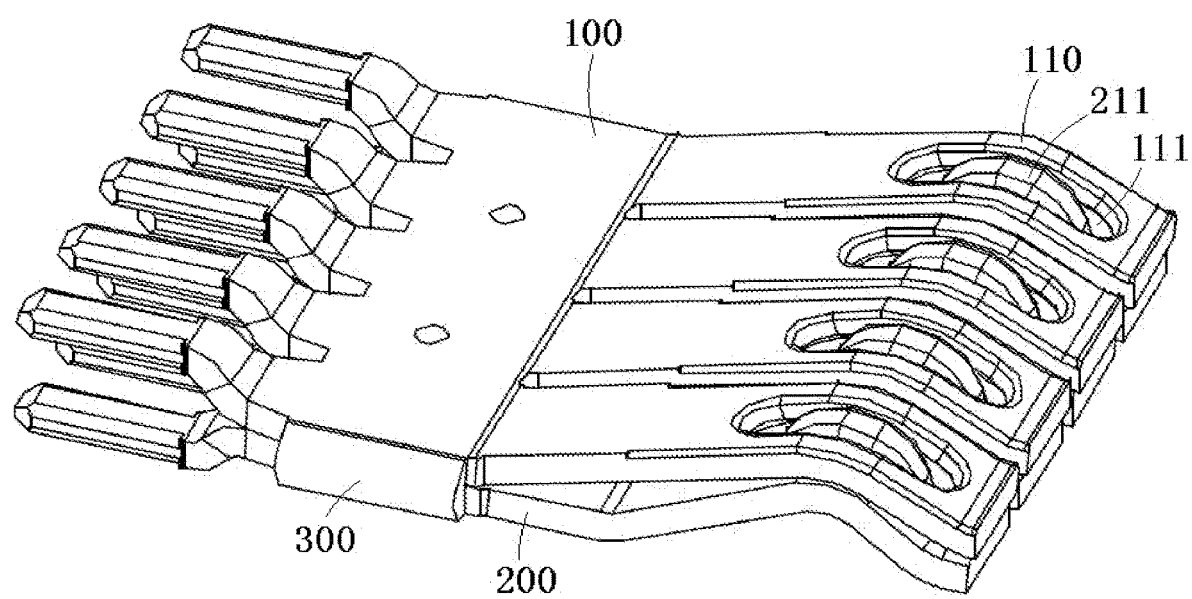
FIG. 3 shows a schematically perspective view of an electrically conductive terminal according to another exemplary embodiment of the present invention.

As shown in FIG. 3, in the illustrated embodiment of the present invention, the first terminal 100 and the second terminal 200 are a single one-piece member made of a single metal material plate. As shown in FIG. 3, the electrically conductive terminal includes a connection portion 300 that connects the first fixing portion of the first terminal 100 and the second fixing portion of the second terminal 200, such that the first terminal 100 and the second terminal 200 are an integral member.

In an embodiment of the present invention, the connector may be a power supply connector, and the electrically conductive terminal may be a power supply terminal.

As shown in FIG. 1, in the illustrated embodiment of the present invention, the electrically conductive terminal is held on the insulation body 30. In an embodiment of the present invention, both the first terminal 100 and the second terminal 200 may be made of copper, or the entire electrically conductive terminal may be made of a single copper material plate.

As shown in FIGS. 1 and 3, in the illustrated embodiments of the present invention, after mating with the mating member, both the first terminal 100 at the outer layer and the second terminal 200 at the inner layer are in electrical contact with the mating member. This permits an increase in the current carrying capacity of the entire electrically conductive terminal.

As shown in FIGS. 1 and 3, in the illustrated embodiments of the present invention, during a process of matching with the mating member, a wipe length of the raised portion 211 of the second terminal 200 at the inner layer with respect to the mating member is equal to a wipe length of the first contact portion 110 of the first terminal 100 at the outer layer with respect to the mating member, resulting in an increase in the electrical contact reliability of the second terminal 200 at the inner layer and the mating member.

It will be understood by those skilled in the art that the embodiments of the present invention described above are exemplary and may be modified by those skilled in the art, and the structures described in various embodiments may be combined freely if they do not conflict in structure or principle.

Although the present invention has been explained with reference to the drawings, embodiments of the present invention illustrated in the drawings are only intended to be illustrative of the preferred embodiments of the present invention and shall not be construed as a limitation of the present invention.

Although some embodiments of the general inventive concepts of the present invention have been shown and described, it will be understood by those with ordinary skills in the art that these embodiments of the present invention may be modified without departing from principles and spirit of the general inventive concepts and the scope of the disclosure is defined by the claims and their equivalents.

It should be noted that the word "include", "comprise", "including", or "comprising" does not exclude other elements or steps. The word "a" or "an" does not exclude a plurality.

What is claimed is:

1. An electrically conductive terminal comprising:
    an outer layer having a first terminal having:
    (a) a first contact portion at an end thereof, the first contact portion including an outer surface side for making contact with a mating member, and
    (b) an opening in the first contact portion; and
    an inner layer having a second terminal positioned on and corresponding with an inner surface side of the first terminal and having:
    (a) a second contact portion at an end thereof, and
    (b) a raised portion on the second contact portion that passes through the opening and extends toward the outer surface side of the first terminal to make contact with the mating member.

2. The electrically conductive terminal according to claim 1, wherein a height of the raised portion on the inner layer is greater than the material thickness of the first contact portion, such that the raised portion protrudes from an outer surface of the first terminal through the opening in the first contact portion when the second terminal abuts against the inner surface side of the first terminal.

3. The electrically conductive terminal according to claim 2, wherein:
    (a) the second terminal abuts against the inner surface side of the first terminal, and
    (b) the raised portion of the second terminal protrudes from the outer surface of the first terminal when the raised portion of the second terminal is mating with the mating member and the raised portion first contacts the mating member and then contacts with the first contact portion of the first terminal.

4. The electrically conductive terminal according to claim 2, wherein there is an interval between the second terminal and the inner surface side of the first terminal such that the raised portion of the second terminal is flush with the outer surface of the first terminal, so that when mating with the mating member, the mating member makes contact simultaneously with the first contact portion of the first terminal and the raised portion of the second terminal.

5. The electrically conductive terminal according to claim 2, wherein there is an interval between the second terminal and the inner surface of the first terminal such that the raised portion of the second terminal is lower than the outer surface of the first terminal, so that when mating with the mating member, the mating member first contacts the first contact portion of the first terminal and pushes the first terminal to elastically to move toward the second terminal, and then the mating member contacts with the raised portion of the second terminal.

6. The electrically conductive terminal according to claim 1, wherein a length of the second terminal is equal to, or greater than, or less than a length of the first terminal.

7. The electrically conductive terminal according to claim 1, wherein a thickness of the second terminal is equal to, or greater than, or less than a thickness of the first terminal.

8. The electrically conductive terminal according to claim 1, wherein:
    (a) the first terminal includes a first fixing portion fixed in an insulation body and has a row of first elastic cantilevers on one side of the first fixing portion,
    (b) the first contact portion is at a free end of each of the first elastic cantilevers,
    (c) the second terminal includes a second fixing portion fixed in the insulation body and has a row of second elastic cantilevers on one side of the second fixing portion,
    (d) the second contact portion is at a free end of each of the second elastic cantilevers, and
    (e) the raised portion on each second contact portion passes through the opening in a corresponding first contact portion in the first terminal in a thickness direction.

9. The electrically conductive terminal according to claim 8, wherein the first fixing portion and the second fixing portion are plate-shaped and parallel to each other and an inclination angle of the first elastic cantilevers with respect to the first fixing portion is smaller than an inclination angle of the second elastic cantilevers with respect to the second fixing portion.

10. The electrically conductive terminal according to claim 9, wherein a length of the first elastic cantilevers is greater than a length of the second elastic cantilevers.

11. The electrically conductive terminal according to claim 8, wherein:
    (a) each opening is in a middle position in a width direction of a corresponding first elastic cantilever, and
    (b) each raised portion is in a middle position in a width direction of a corresponding second elastic cantilever.

12. The electrically conductive terminal according to claim 8, wherein the opening is a closed hole or an opened hole formed in the first elastic cantilever.

13. The electrically conductive terminal according to claim 8, wherein:

(a) the first terminal further includes a row of first connection legs on the other side of the first fixing portion and adapted to be electrically connected to a circuit board, and (b) the second terminal further includes a row of second connection legs on the other side of the second fixing portion and adapted to be electrically connected to the circuit board.

14. The electrically conductive terminal according to claim 13, wherein:

(a) the first connection legs are pin-shaped solder legs adapted to be soldered into a hole of the circuit board, or plate-shaped solder legs adapted to be soldered onto a surface of the circuit board, or a fisheye-shaped plug-in legs adapted to be plugged into a hole of the circuit board;

(b) the second connection legs are pin-shaped solder legs adapted to be soldered into a hole of the circuit board, or plate-shaped solder legs adapted to be soldered onto a surface of the circuit board, or fisheye-shaped plug-in legs adapted to be plugged into a hole of the circuit board.

15. The electrically conductive terminal according to claim 8, wherein the electrically conductive terminal further includes a connection portion that connects the first fixing portion of the first terminal and the second fixing portion of the second terminal together, such that the first terminal and the second terminal form an integral member.

16. The electrically conductive terminal according to claim 1, wherein the first terminal and the second terminal are two independent members separated from each other.

17. The electrically conductive terminal according to claim 1, wherein the first terminal and the second terminal are formed into a single one-piece member from a single metal material plate.

18. A connector, comprising:
an electrically conductive terminal comprising:
an outer layer having a first terminal having:
(a) a first contact portion at an end thereof, the first contact portion including an outer surface side for making contact with a mating member, and
(b) an opening in the first contact portion; and
an inner layer having a second terminal positioned on and corresponding with an inner surface side of the first terminal and having:
(a) a second contact portion at an end thereof, and
(b) a raised portion on the second contact portion that passes through the opening and extends toward the outer surface side of the first terminal to make contact with the mating member; and
an insulation body, in which the electrically conductive terminal is held.

19. The connector according to claim 18, wherein the connector is a power supply connector.

20. An electrically conductive terminal comprising:
an outer layer having a first terminal having:
(a) a first contact portion at an end thereof, and
(b) an opening in the first contact portion; and
an inner layer having a second terminal positioned on and abutting an inner surface side of the first terminal, the second terminal having:
(a) a second contact portion at an end thereof, and
(b) a raised portion on the second contact portion that passes through the opening in the first terminal to make electrical contact with a mating member, the raised portion having a height that is greater than a material thickness of the first contact portion, the raised portion protrudes from an outer surface of the first terminal through the opening when the second terminal abuts against the inner surface side of the first terminal so that on mating the mating member first contacts the raised portion and then contacts the first contact portion.

21. The electrically conductive terminal according to claim 20, wherein there is an interval between the second terminal and the inner surface side of the first terminal such that the raised portion of the second terminal is flush with the outer surface of the first terminal, so that when mating with the mating member, the mating member makes contact simultaneously with the first contact portion of the first terminal and the raised portion of the second terminal.

22. The electrically conductive terminal according to claim 20, wherein there is an interval between the second terminal and the inner surface of the first terminal such that the raised portion of the second terminal is lower than the outer surface of the first terminal, so that when mating with the mating member, the mating member first contacts the first contact portion of the first terminal and pushes the first terminal to elastically to move toward the second terminal, and then the mating member contacts with the raised portion of the second terminal.

23. An electrically conductive terminal comprising:
an insulation body;
an outer layer having a first terminal having:
(a) a first fixing portion fixed in the insulation body and having a row of first elastic cantilevers on one side of the first fixing portion
(b) a plurality of first contact portions, each contact portion of the plurality of contact portions positioned at a free end of each of the first elastic cantilevers, and
(c) an opening in each of the plurality of contact portions; and
an inner layer having a second terminal on an inner surface side of the first terminal and having:
(a) a second fixing portion fixed in the insulation body and having a row of second elastic cantilevers on one side of the second fixing portion,
(b) a plurality of second contact portions, each second contact portion positioned at free ends of each of the second elastic cantilevers, and
(c) a plurality of raised portions, each raised portion positioned on and extending from the plurality of second contact portions and passing through each opening in plurality of first contact portions of the first terminal in a thickness direction.

24. The electrically conductive terminal according to claim 23, wherein the first fixing portion and the second fixing portion are plate-shaped and parallel to each other and an inclination angle of the row of first elastic cantilevers with respect to the first fixing portion is smaller than an inclination angle of the row of second elastic cantilevers with respect to the second fixing portion.

25. The electrically conductive terminal according to claim 24, wherein a length of the row of first elastic cantilevers is greater than a length of the row of second elastic cantilevers.

26. The electrically conductive terminal according to claim 23, wherein:
(a) each opening of the plurality of openings is in a middle position in a width direction of a corresponding first elastic cantilever of the row of first elastic cantilevers, and (b) each raised portion of the plurality of raised portions is in a middle position in a width direction of a corresponding second elastic cantilever of the row of second elastic cantilevers.

27. The electrically conductive terminal according to claim 23, wherein:
   (a) the first terminal further includes a row of first connection legs on the other side of the first fixing portion and adapted to be electrically connected to a circuit board, and
   (b) the second terminal further includes a row of second connection legs on the other side of the second fixing portion and adapted to be electrically connected to the circuit board.

28. The electrically conductive terminal according to claim 27, wherein:
   (a) the row of first connection legs are pin-shaped solder legs adapted to be soldered into a hole of the circuit board, or plate-shaped solder legs adapted to be soldered onto a surface of the circuit board, or a fisheye-shaped plug-in legs adapted to be plugged into a hole of the circuit board;
   (b) the row of second connection legs are pin-shaped solder legs adapted to be soldered into a hole of the circuit board, or plate-shaped solder legs adapted to be soldered onto a surface of the circuit board, or fisheye-shaped plug-in legs adapted to be plugged into a hole of the circuit board.

29. The electrically conductive terminal according to claim 23, wherein the electrically conductive terminal further includes a connection portion that connects the first fixing portion of the first terminal and the second fixing portion of the second terminal together, such that the first terminal and the second terminal form an integral member.

30. An electrically conductive terminal comprising:
   an outer layer having a first terminal having:
   (a) a first contact portion at an end thereof for making contact with a mating member, and
   (b) an opening in the first contact portion; and
   an inner layer having a second terminal formed into a single one-piece member with the first terminal from a single metal material plate, the second terminal positioned on an inner surface side of the first terminal and having:
   (a) a second contact portion at an end thereof, and
   (b) a raised portion on the second contact portion that passes through the opening in the first terminal to make contact with the mating member.

* * * * *